United States Patent
Lu et al.

(10) Patent No.: US 9,858,984 B2
(45) Date of Patent: *Jan. 2, 2018

(54) APPARATUSES, METHODS, AND SYSTEMS FOR INCREASING A SPEED OF REMOVAL OF DATA FROM A MEMORY CELL

(71) Applicant: Intel Corporation, Santa Clara, CA (US)

(72) Inventors: Shih-Lien Lu, Portland, OR (US); Helia Naeimi, Santa Clara, CA (US); Shigeki Tomishima, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/389,223

(22) Filed: Dec. 22, 2016

(65) Prior Publication Data

US 2017/0103801 A1 Apr. 13, 2017

Related U.S. Application Data

(62) Division of application No. 14/748,009, filed on Jun. 23, 2015, now Pat. No. 9,558,807.

(51) Int. Cl.
*G11C 11/24* (2006.01)
*G11C 11/4094* (2006.01)
(Continued)

(52) U.S. Cl.
CPC ...... *G11C 11/4094* (2013.01); *G11C 11/4074* (2013.01); *G11C 11/4096* (2013.01)

(58) Field of Classification Search
USPC ... 365/149, 189.09, 204, 226, 227, 228, 229
See application file for complete search history.

(56) References Cited

U.S. PATENT DOCUMENTS 5,870,348 A 2/1999 Tomishima et al.
6,205,067 B1 3/2001 Tsukude
(Continued)

OTHER PUBLICATIONS

George Ou, "Cryogenically frozen RAM bypasses all disk encryption methods," ZDNET, Feb. 21, 2008, 3 pages, http://www.zdnet.com/blog/security/cryogenically-frozen-ram-bypasses-all-disk-encryption-methods/900 (accessed Jul. 7, 2015).
Declan McCullagh, "Disk encryption may not be secure enough, new research finds," CNET, Feb. 21, 2008, 5 pages, http://www.cnet.com/news/disk-encryption-may-not-be-secure-enough-new-research-finds/ (accessed Jul. 7, 2015).
(Continued)

*Primary Examiner* — Anthan Tran
(74) *Attorney, Agent, or Firm* — Schwabe, Williamson & Wyatt, P.C.

(57) ABSTRACT

Embodiments include apparatuses and systems including a circuit which increases a speed of removal of data stored in a memory cell. In embodiments, the circuit includes a first discharge device coupled to an access transistor of a memory cell and coupled to an output terminal of a charge pump circuit to pull up a first voltage level at the output terminal to ground in response to a signal to accelerate leakage of a first leakage current; and a second discharge device coupled to a voltage generator circuit to pull down a second voltage level at a cell plate node of the memory cell to ground in response to the signal to accelerate leakage of a second leakage current, wherein the cell plate node is coupled to a storage node of the memory cell by a capacitor. Other embodiments may also be described and claimed.

17 Claims, 5 Drawing Sheets

(51) Int. Cl.
    *G11C 11/4096* (2006.01)
    *G11C 11/4074* (2006.01)

(56) References Cited

U.S. PATENT DOCUMENTS

| | | |
|---|---|---|
| 6,414,890 B2 | 7/2002 | Arimoto et al. |
| 2009/0207165 A1* | 8/2009 | Shirai ................. G09G 3/3413 |
| | | 345/214 |

OTHER PUBLICATIONS

Halderman, et al, "Lest We Remember: Cold Boot Attacks on Encryption Keys," Princeton University, Electronic Frontier Foundation, Wind River Systems, Feb. 21, 2008, 16 pages.

J. G. Ooi et al, "A Proof of Concept on Defending Cold Boot Attack", the proceedings of the 1st International Symposium on Quality Electronic Design—Asia, pp. 330-335, 2009.

H. Riebler, et al, "FPGA-accelerated Key Search for Cold-Boot Attacks against AES", 2013 International Conference on Field-Programmable Technology (FPT), pp. 386-389, 2013.

M. Gruhn et al, "On the Practicability of Cold Boot Attacks", 2013 Eighth International Conference on Availability, Reliability and Security (ARES), pp. 390-397, 2013.

Non-Final Office Action dated Apr. 21, 2016 for U.S. Appl. No. 14/748,009, 10 pages.

Notice of Allowance dated Sep. 19, 2016 for U.S. Appl. No. 14/748,009, 11 pages.

\* cited by examiner

APPARATUSES, METHODS, AND SYSTEMS FOR INCREASING A SPEED OF REMOVAL OF DATA FROM A MEMORY CELL

CROSS REFERENCE TO RELATED APPLICATION

The present application is a divisional of U.S. patent application Ser. No. 14/748,009, filed Jun. 23, 2015, which has issued as U.S. Pat. No. 9,558,807, entitled "APPARATUSES AND SYSTEMS FOR INCREASING A SPEED OF REMOVAL OF DATA STORED IN A MEMORY CELL," the entire disclosure of which is hereby incorporated by reference in its entirety.

FIELD

Embodiments of the present invention relate generally to the technical field of electronic circuits, and more particularly to removal of data stored in a memory cell.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Volatile memory devices, such as for example, Random Access Memory (RAM) including Dynamic RAM ("DRAM") are generally considered to be secure because it is believed that their memories are erased immediately upon losing power. At normal operating temperatures, however, DRAM memory may take up to a few seconds after power is lost to dissipate, while at lower temperatures data can remain for minutes or even hours. This delay can leave the device vulnerable to a variety of attacks. For example, a cold-boot attack can occur when an attacker has physical access to a machine while a security key remains in main memory. The security key can be extracted from memory, defeating extensive security measures, such as for example, full-disk encryption. Software changes and/or hardware changes to avoid these security vulnerabilities may require significant time and expense to implement.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Figure 1:
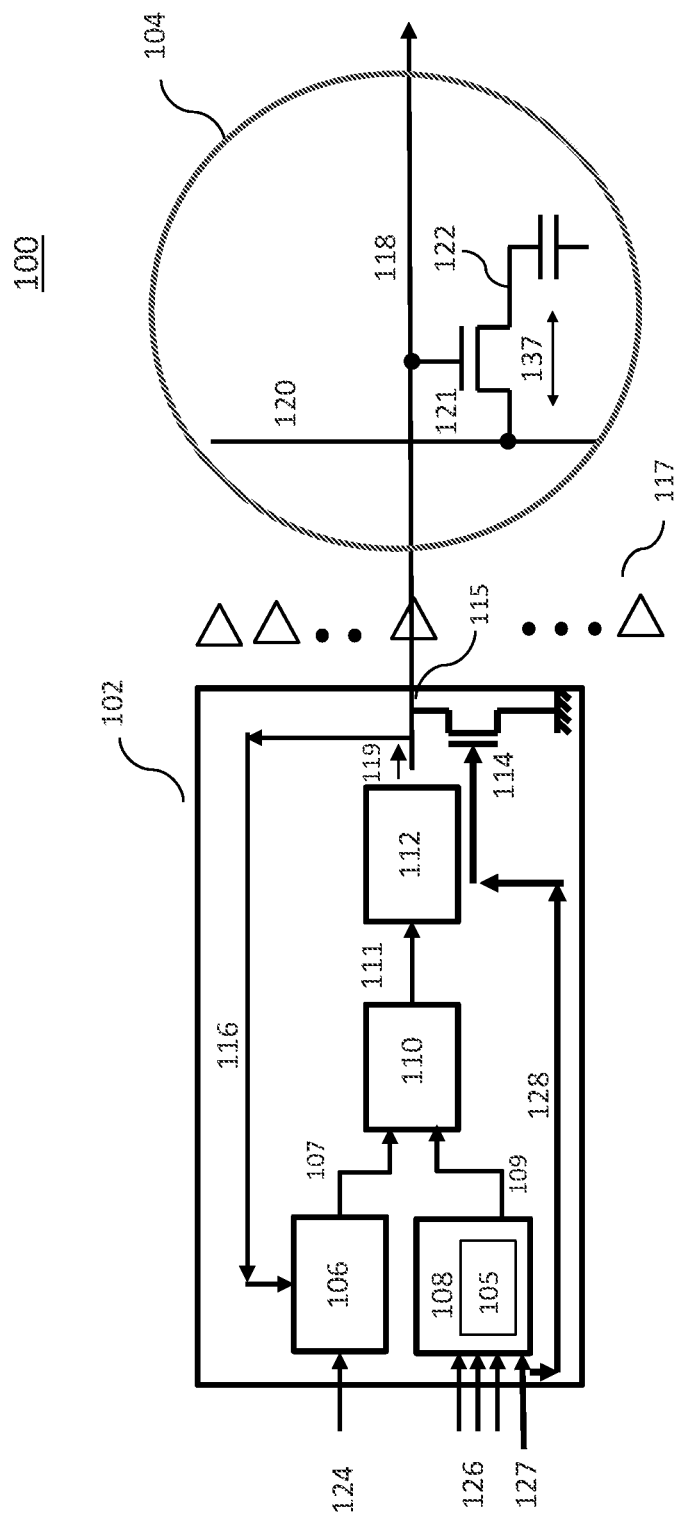
FIG. 1 illustrates an example circuit associated with increasing a speed of removal of data stored in a memory cell in accordance with various embodiments.

FIG. 1 illustrates an example portion of a device 100 including a circuit 102 coupled to a memory cell 104. For example, in embodiments, device 100 may be a portion of a memory chip such as a DRAM memory device or other suitable volatile memory device. In embodiments, circuit 102 may include a negative charge pump circuit while memory cell 104 may include a volatile memory cell coupled to a word line (WL) 118 and a bit line (BL) 120. In embodiments, circuit 102 may include a level detector 106, control logic 108, ring oscillator 110, and boost circuits 112. In embodiments, a discharge device 114, such as for example, a transistor may be coupled to an output terminal 115 of circuit 102. In various embodiments, discharge device 114 may include an n-type Metal-Oxide-Semiconductor Field-Effect-Transistor ("NMOS") or other suitable transistor such as a p-type Metal-Oxide-Semiconductor Field-Effect-Transistor ("PMOS") or other discharge device. In embodiments, memory cell 104 may include an access transistor 121 and a storage node 122. As shown, in embodiments, level detector 106 may be coupled to receive an input signal such as, e.g., a reference voltage signal 124 in order to provide an ON/OFF signal 107 to ring oscillator 110. In embodiments, control logic 108 includes a detection logic 105 to detect one or more input control signals 126 and in some embodiments, an attack signal 127.

In embodiments, control logic 108 may provide a control signal 109 to ring oscillator 110 to control a circuit operation mode of circuit 102. In turn, ring oscillator 110 may provide an oscillator clock signal 111 to control a charge pump operation to generate a desired voltage level and the circuit operation mode to boost circuits 112 to allow boost circuits 112 to output a boosted voltage signal 119 (e.g., of −0.3 volts or other desired voltage level) to word drivers 117. In embodiments, when word line 118 is off, circuit 102 may provide a desired $V_{neg}$ (e.g., of approximately −0.3 volts) to the word line 118 via word drivers 117 to achieve a low sub-threshold leakage current in sub-threshold leakage area 137, to maintain a long retention time for storage node 122. In embodiments, sub-threshold leakage area 137 may refer to a sub-threshold leakage area between a source and a drain of access transistor 121. Note that in embodiments, boosted voltage signal 119 may follow a feedback path 116 to allow level detector 106 to determine whether boosted voltage signal 119 should be adjusted.

Accordingly, in the embodiment, detection logic 105 may detect an attack signal 127. In embodiments, attack signal 127 may be indicative of a cold-boot attack or other attack where unencrypted data may be retrieved from DRAM. In other embodiments, detection logic 105 may detect one or more input control signals 126 received in response to a device power-off signal (e.g., when the device 100 powers off). In embodiments, one or more input control signals may signal one or more of a sleep mode, hibernation mode, hybrid mode, other power-saving mode, power-off, shutdown of device 100. In embodiments, in response to receiving one or more input control signals 126 or attack signal 127, control logic 108 may disable ring oscillator 110 via control signal 109. As a result, in embodiments, circuit 102 may be deactivated as a negative charge pump.

In embodiments, in response to receiving attack signal 127, control logic 108 may send an activation signal 128 to open or activate discharge device 114 to short boosted voltage signal 119, bringing word line 118 to a ground voltage level or higher, accelerating a leakage of charge or leakage current in a sub-threshold leakage area 137. Accordingly, in embodiments, deactivating circuit 102 and thus its output of negative charge in combination with activating discharge device 114 to accelerate leakage of the charge may increase a speed of destruction or erasure of data, e.g. data high, in memory cell 104. Note that in embodiments, raising word line 118 and a gate voltage of access transistor 121 from −0.3 volts to 0 volts or ground can increase leakage current in sub-threshold leakage area 137 generally or, in some embodiments, easily by three orders of magnitude, increasing the speed of removal of data significantly.

Figure 2:
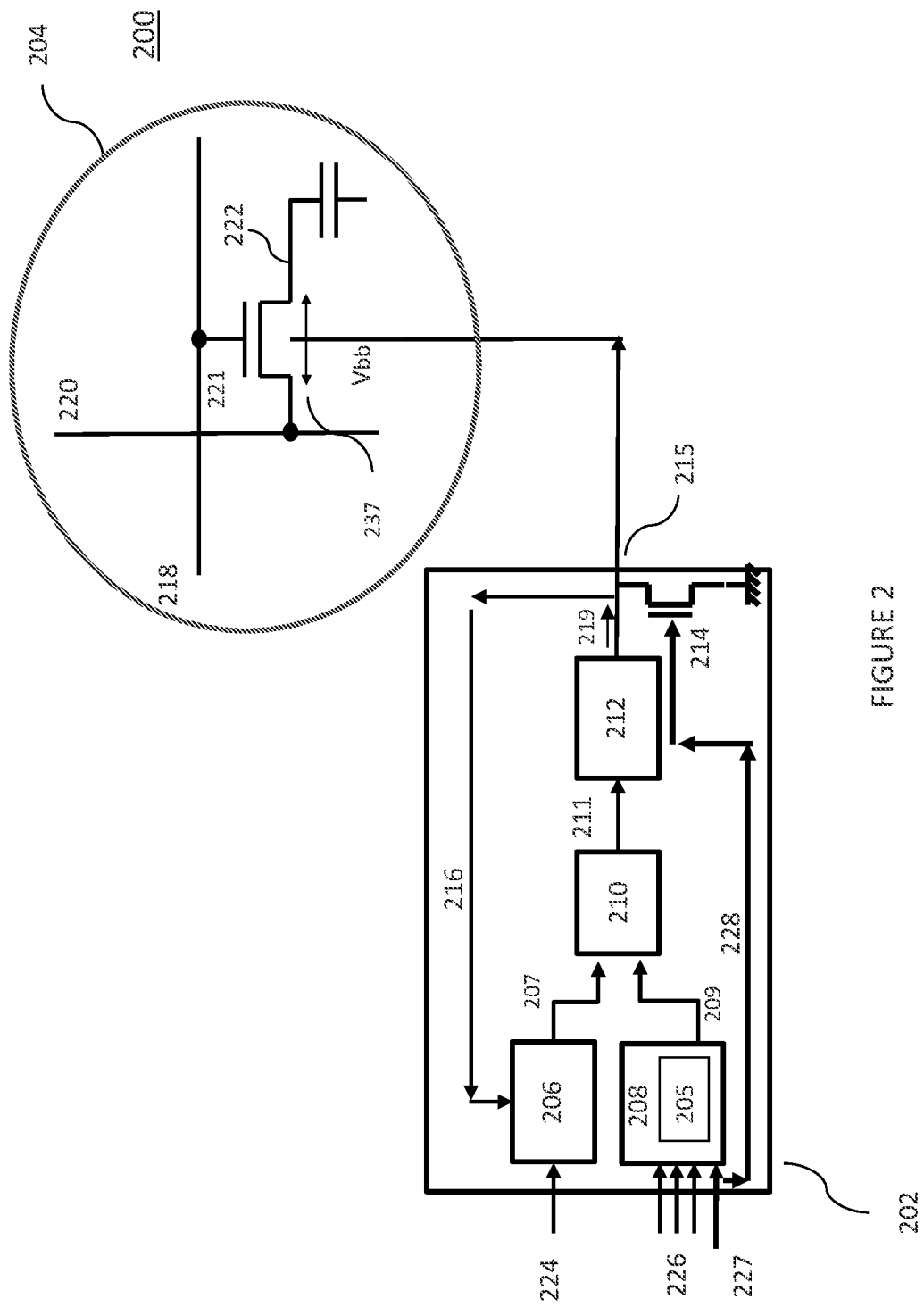
FIG. 2 illustrates another example circuit associated with increasing a speed of removal of data stored in a memory cell in accordance with various embodiments.

FIG. 2 illustrates another example portion of a device 200 including a circuit 202 associated with increasing a speed of removal or erasure of data stored in a memory cell in accordance with various embodiments. In embodiments, an increase in a transistor back-gate voltage $V_{bb}$ at access transistor 221 may accelerate a leakage of leakage current or charge in a sub-threshold leakage area 237 of access transistor 221. As shown, in embodiments, similar in configuration to circuit 102 of FIG. 1, circuit 202 may include a negative charge pump circuit while memory cell 204 may include a volatile memory cell such as, e.g., a DRAM cell coupled to a word line 218 and a bit line 220. In embodiments, circuit 202 may include a level detector 206, control logic 208, ring oscillator 210, and boost circuits 212. In embodiments, a discharge device 214, such as for example, an NMOS transistor or other suitable discharge device, may be coupled to an output terminal 215 of circuit 202. In embodiments, memory cell 204 may include access transistor 221 and a storage node 222. As shown, in embodiments, level detector 206 may be coupled to receive an input signal such as, e.g., a reference voltage signal 224 in order to provide an ON/OFF signal 207 to ring oscillator 210. In embodiments, control logic 208 may include a detection logic 205 to detect one or more input control signals 226 and an attack signal 227. Accordingly, in embodiments, control logic 208 may determine a control signal 209 to be provided to ring oscillator 210 to control an operation mode of circuit 202.

In embodiments, ring oscillator 210 may provide an oscillator clock signal 211 to control a charge pump operation to boost circuits 212 to enable boost circuits 212 to output a boosted voltage signal 219 of −0.3 volts or other desired voltage level to supply transistor back-gate voltage $V_{bb}$. Note that in embodiments, boosted voltage signal 219 may also follow a feedback path 216 to allow level detector 206 to determine whether boosted voltage signal 219 may need to be adjusted. Accordingly, in the embodiment, control logic 208 may detect an attack signal 227. In embodiments, attack signal 227 may be indicative of a cold-boot attack. In other embodiments, detection logic 205 may detect one or more input control signals 226, e.g. as received in response to a device power-off signal. In embodiments, in response to receiving a particular input control signal 226 or attack signal 227, control logic 208 may disable an operation of circuit 202. As a result, in embodiments, circuit 202 may no longer be activated as a negative charge pump. In embodiments, control logic 208 may at a same or similar time, send an activation signal 228 to open or activate discharge device 214 to bring boosted voltage signal 219 of circuit 202 to ground voltage level or higher, raising transistor back-gate voltage $V_{bb}$, thus accelerating leakage of leakage current in sub-threshold leakage area 237. Accordingly, in embodiments, deactivating circuit 202 in combination with activating discharge device 214 may accelerate a removal of stored data in memory cell 204.

Figure 3:
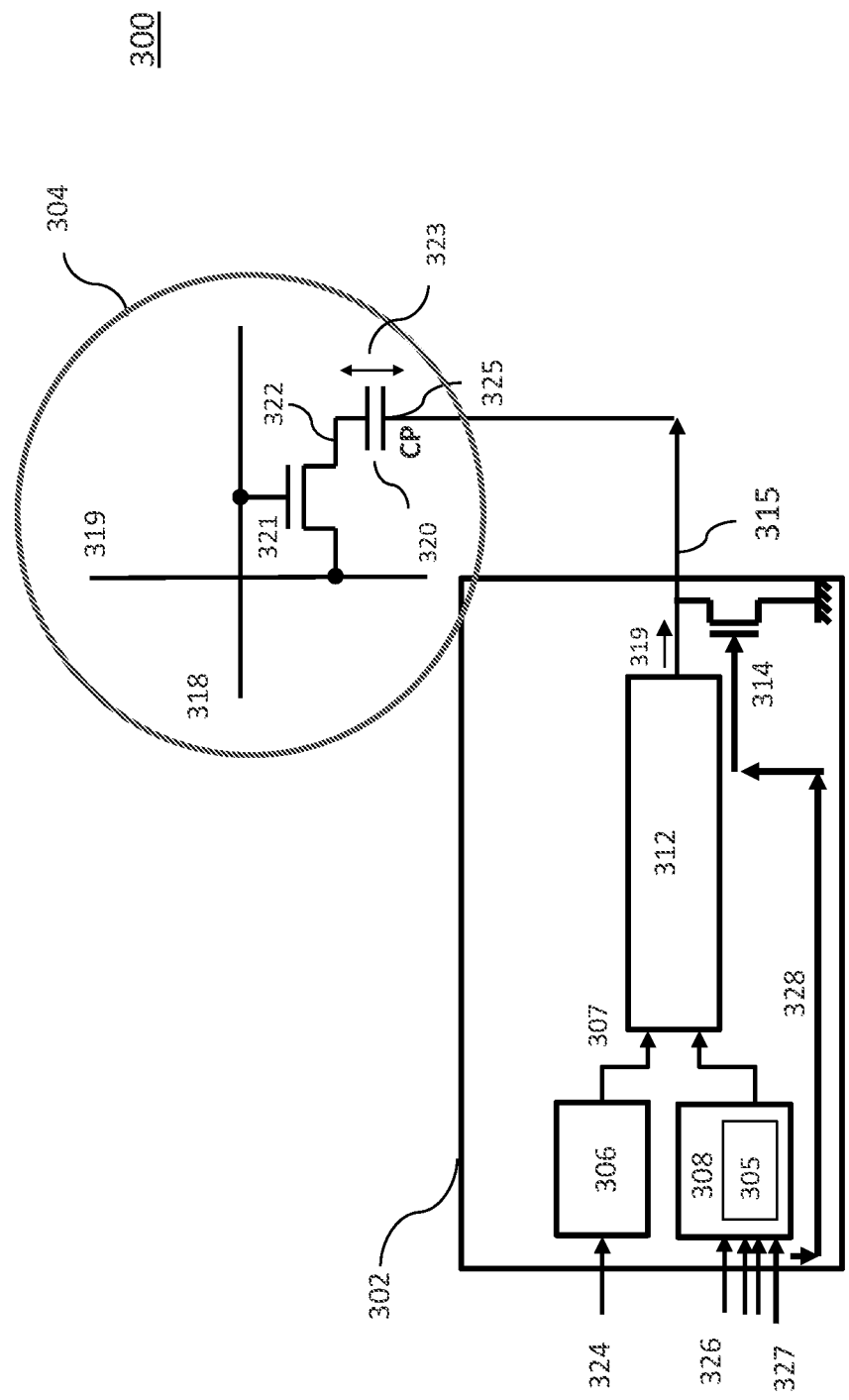
FIG. 3 illustrates another example circuit associated with increasing a speed of removal of data stored in a memory cell in accordance with various embodiments.

FIG. 3 illustrates another example portion of a device 300 associated with increasing a speed of removal of data stored in a memory cell in accordance with various embodiments. Example portion of device 300 may include a circuit 302 coupled to a memory cell 304. In embodiments, memory cell 304 may include a volatile memory cell such as e.g., a DRAM cell coupled to a word line 318 and a bit line 319. In embodiments, circuit 302 may include a level detector 306, control logic 308, and voltage generator circuits 312. In embodiments, a discharge device 314, such as for example, an NMOS transistor or other suitable transistor may be coupled to an output terminal 315 of circuit 302. In embodiments, memory cell 304 may include an access transistor 321 and a storage node 322. The memory cell 304 may further include a capacitor 320 coupled between the storage node 322 and the output terminal 315. A cell plate node 325 (CP) of the capacitor 320 may be coupled to output terminal 315. As shown, in embodiments, level detector 306 may be coupled to receive an input signal such as, e.g., a reference voltage signal 324 in order to determine a voltage level signal 307 to be provided to voltage generator circuits 312. In embodiments, control logic 308 includes a detection logic 305 to detect one or more input control signals 326 and in embodiments, an attack signal 327.

In embodiments, control logic 308 may provide control signal 309 to voltage generator circuits 312 to control an operation mode of circuit 302 while level detector 306 may provide voltage level signal 307 to voltage generator circuits 312 to allow voltage generator circuits 312 to produce a voltage signal 319 having a voltage level of approximately half-Vcc or other appropriate voltage level. In embodiments, a storage voltage level for a logic "1" may correspond to a voltage level of $V_{cc}$ while a logic "0" may correspond to ground. In embodiments, an output terminal 315 of circuit 302 may be coupled to provide voltage signal 319 to cell plate node 325 (CP) of memory cell 304.

Accordingly, in the embodiment, control logic 308 may detect an attack signal 327. In embodiments, an increased voltage difference may produce an increase in a leakage current of dielectric tunneling leakage current area 323 of capacitor 320 that may remove or erase stored data stored in storage node 322, for example, for a stored data level of high. In embodiments, attack signal 327 may be indicative of a cold-boot attack. In other embodiments, detection logic 305 may detect a particular input control signal 326 received in response to a device power-down or power-off signal. In embodiments, in response to receiving attack signal 327 or particular input control signal 326, control logic 308 may disable an operation of voltage generator circuits 312. As a result, in embodiments, circuit 302 may no longer produce a voltage level of half-$V_{cc}$. In embodiments, in response to receiving attack signal 327, control logic 308 may send an activation signal 328 to open or activate discharge device 314 to bring voltage signal 319 rapidly from half-$V_{cc}$ voltage level to ground voltage level, reducing a voltage at cell plate node 325, thus increasing the leakage current of or around dielectric tunneling leakage current area 323. Accordingly, in embodiments, disabling operation of voltage generator circuits 312 as well as activating discharge device 314 may increase a speed of erasure of stored data in memory cell 304.

Figure 4:
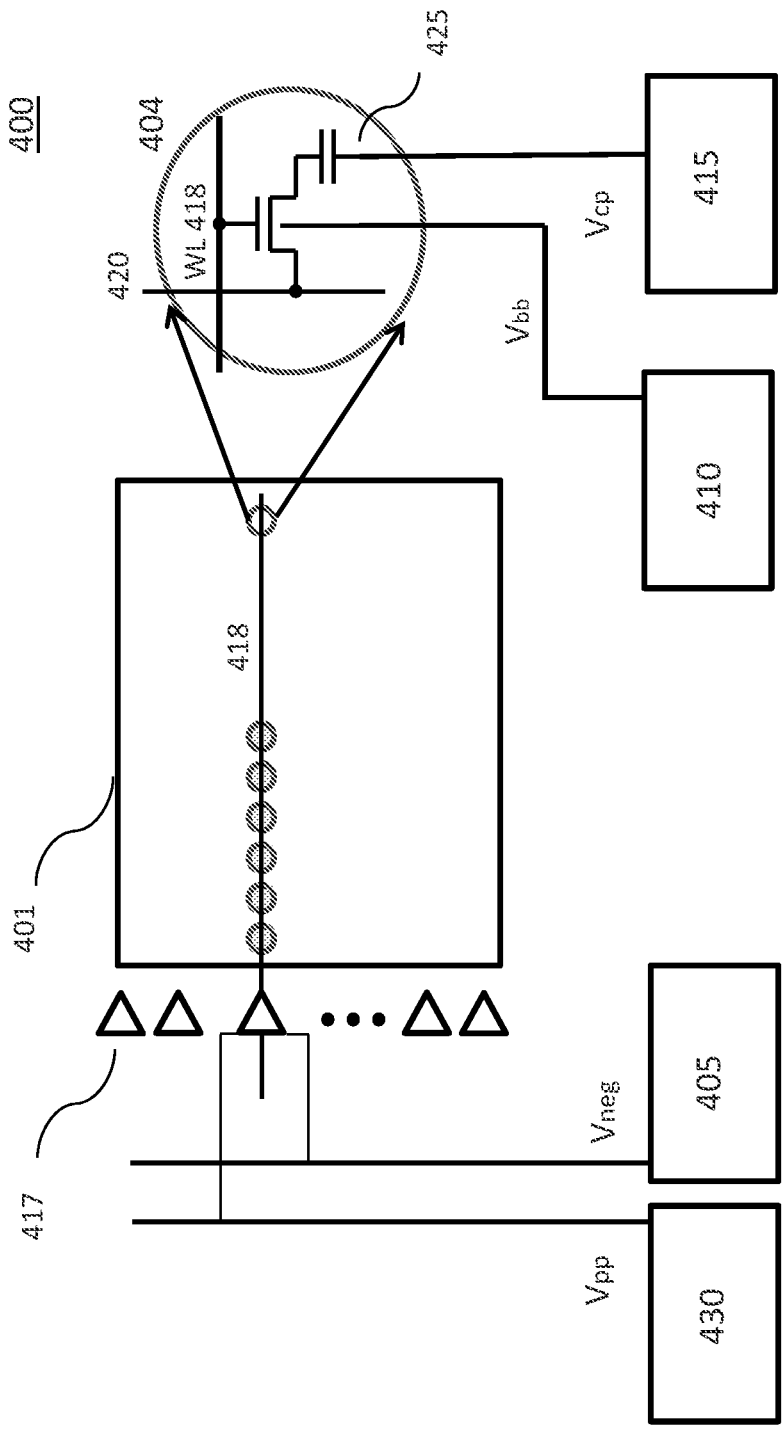
FIG. 4 illustrates an example device associated with the example circuits of FIGS. 1-3 in accordance with various embodiments.

FIG. 4 illustrates an example portion of a device 400 associated with the example circuits of FIGS. 1-3. In embodiments, portion of device 400 may include a portion of a memory chip such as a DRAM memory chip including a memory array 401 including a plurality of memory cells such as, for example, memory cell 404 coupled to a word line 418 and a bit line 420. Portion of device 400 may also include a positive charge pump circuit 430 to provide a power supply $V_{pp}$ to word drivers 417. In embodiments, next to positive charge pump circuit 430, is a first circuit 405 which may include a circuit similar to that of circuit 102 including a discharge device 114 of FIG. 1 which may be coupled to word line 418 to raise $V_{neg}$ to a voltage level of ground or higher upon receiving by first circuit 405 an input control signal or attack signal in embodiments. Accordingly, a second circuit 410 may include a second discharge device similar to discharge device 214 as described in connection with FIG. 2. In embodiments, second circuit 410 may be coupled to raise a transistor back-gate voltage $V_{bb}$ to a voltage level of ground or higher near an access transistor of memory cell 404 upon receiving by second circuit 410 an input control signal or attack signal. Finally, a third circuit 415 may include a voltage generator circuit coupled to a cell plate node 425 and including a discharge device similar to discharge device 314 of FIG. 3 to lower $V_{cp}$ from a voltage level of half-$V_{cc}$ or other operating voltage level upon receiving by third circuit 415 an input control signal or attack signal. In embodiments, third circuit 415 may be coupled to a plurality of memory cells of memory array 401. In embodiments, one or more of first circuit 405, second circuit 410, and third circuit 415 may be used alone or together in portion of device 400 in order to increase a speed of erasure of data in memory cell 404.

Figure 5:
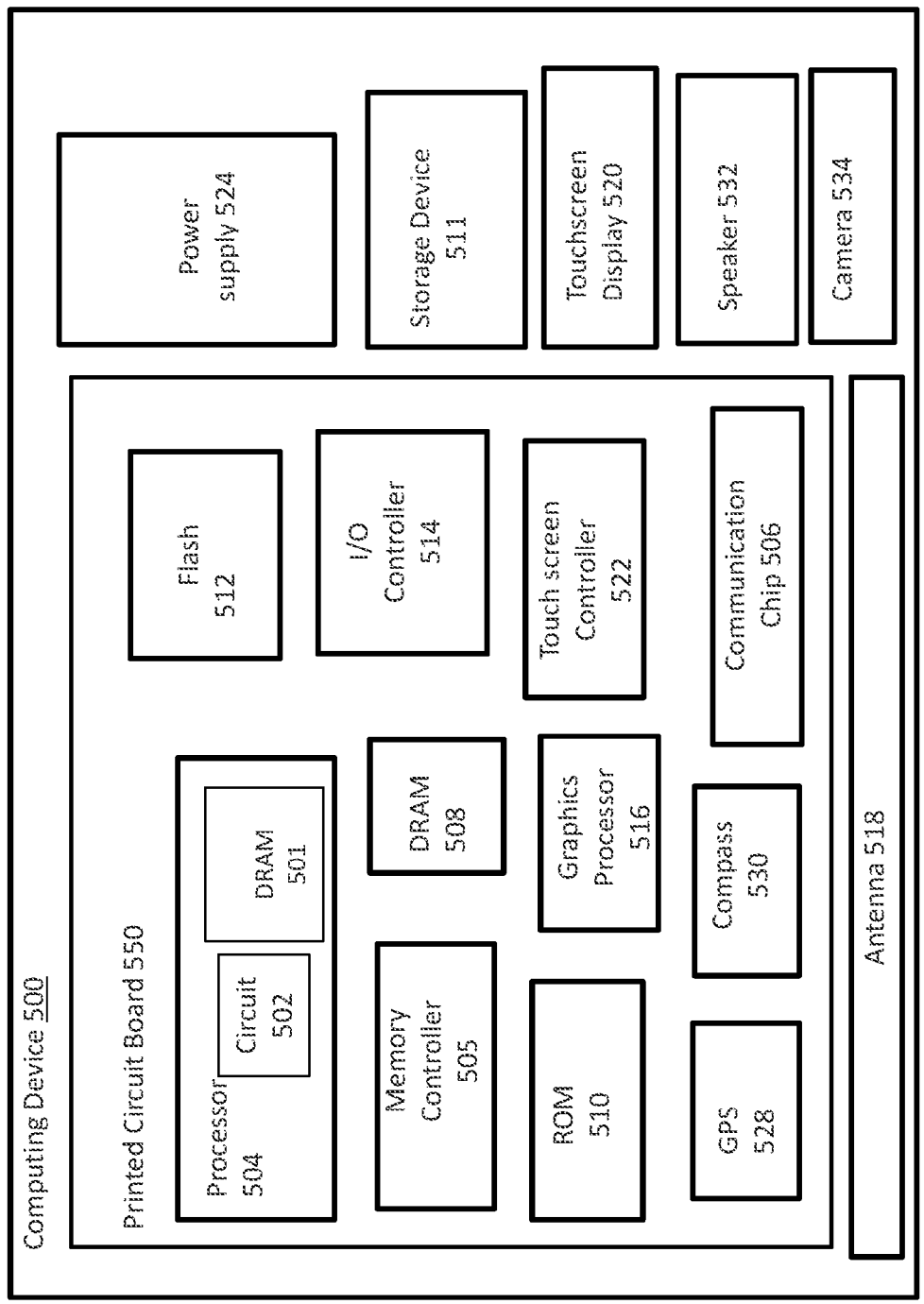
FIG. 5 illustrates an example system configured to employ the apparatuses and methods described herein, in accordance with various embodiments.

FIG. 5 illustrates an example computing device 500 that may employ the apparatuses and/or methods described in connection with the above in accordance with various embodiments. As shown, computing device 500 may include a circuit 502 coupled to a DRAM memory 501 and located in a cache of one or more processor(s) 504. In embodiments, DRAM memory 501 may be an embedded DRAM. In embodiments, circuit 502 may include a circuit such as for example, circuits 102, 202, or 302 as described in connection with FIGS. 1-3. In various embodiments, circuit 502 may be located in other suitable blocks in computing device 500 such as coupled to DRAM 508 or other DRAM (or suitable non-volatile memory) in graphics processor 516 or any of memory controller 505, I/O controller 514, or touchscreen controller 522.

In various embodiments, the one or more processor(s) 504 each may include one or more processor cores. In various embodiments, at least one communication chip 506 may be physically and electrically coupled to the one or more processor(s) 504 or the communication chip 506 may be part of the one or more processor(s) 504. In various embodiments, computing device 500 may include printed circuit board (PCB) 550. For these embodiments, the one or more processor(s) 504 and communication chip 506 may be disposed thereon. In alternate embodiments, the various components may be coupled without the employment of PCB 550. Depending on its applications, computing device 500 may include other components that may or may not be physically and electrically coupled to the PCB 550. These other components include, but are not limited to, memory controller 505, non-volatile memory such as read only memory (ROM) 510, flash memory 512, storage device 511 (e.g., a hard-disk drive (HDD)), an I/O controller 514, a digital signal processor (not shown), a crypto processor (not shown), a graphics processor 516, one or more antenna 518, a display (not shown), a touch screen display 520, a touch screen controller 522, a battery also referred to as power supply 524, an audio codec (not shown), a video codec (not shown), a global positioning system (GPS) device 528, a compass 530, an accelerometer (not shown), a gyroscope (not shown), a speaker 532, a camera 534, and a mass storage device (such as hard disk drive, a solid state drive, compact disk (CD), digital versatile disk (DVD)) (not shown), and so forth. In various embodiments, the processor 504 may be integrated on the same die with other components to form a System on Chip (SoC).

In some embodiments, the one or more processor(s) 504, flash memory 512, and/or storage device 511 may include associated firmware (not shown) storing programming instructions configured to enable computing device 500, in response to execution of the programming instructions by one or more processor(s) 504, to practice all or selected aspects of the methods described herein. The communication chips 506 may enable wired and/or wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 500 may be any other electronic device that processes data.

Some non-limiting Examples are provided below.

Example 1 is a circuit to increase a speed of erasure of data in a memory cell, comprising a control logic including a detection logic to detect a signal; a boost circuit coupled to the control logic to allow the control logic to disable an operation of the boost circuit in response to detection of the signal; and a discharge device coupled to an output terminal of the boost circuit to accelerate leakage of a leakage current in response to the detection of the signal, wherein the leakage current is a leakage current associated with an access transistor of the memory cell coupled to the discharge device, and wherein acceleration of the leakage of the leakage current and the disablement of the operation of the boost circuit increases the speed of erasure of data in the memory cell.

Example 2 is the circuit of Example 1, wherein the access transistor comprises an access transistor of a dynamic random access memory (DRAM) cell.

Example 3 is the circuit of Example 1 wherein the control logic, boost circuit, and discharge device comprise parts of a charge pump circuit and the discharge device comprises a transistor.

Example 4 is the circuit of any one of Examples 1-3, wherein the signal is a control signal received in response to a dynamic random access memory (DRAM) power-off signal.

Example 5 is the circuit of Example 1, wherein the signal comprises an attack signal issued in response to a cold-boot attack.

Example 6 is the circuit of Example 1, wherein in response to the detection of the signal, the discharge device is controllable to short an output signal of the boost circuit from a negative voltage to ground Example 7 is the circuit of any one of Examples 1-6, further including a ring oscillator coupled to the boost circuit, wherein in response to the detection of the signal, the control logic is controllable to disable the ring oscillator.

Example 8 is the circuit of any one of Examples 1-7, wherein the signal comprises a signal indicating a power down of a memory chip including the memory cell.

Example 9 is the circuit of any one of Examples 1-8, wherein the discharge device comprises a first discharge device, the circuit further comprising a voltage generator including a second discharge device coupled to a storage node of the memory cell.

Example 10 is a circuit to increase a speed of erasure of data in a memory cell, comprising: a first discharge device coupled to an output terminal of a charge pump circuit to pull up a first voltage level at the output terminal to ground in response to a signal in order to accelerate leakage of a first leakage current; and a second discharge device coupled to a voltage generator circuit to pull down a second voltage level at a cell plate node to ground in response to the signal in order to accelerate leakage of a second leakage current, wherein the first discharge device is coupled to an access transistor of the memory cell and the second discharge device is coupled to the cell plate node of a storage node of the memory cell and wherein acceleration of the first leakage current and the second leakage current increases the speed of erasure of data in the memory cell.

Example 11 is the circuit of Example 10 wherein the charge pump circuit and the voltage generator circuit each include a control logic to detect the signal.

Example 12 is the circuit of Example 10, wherein the first and second discharge devices are transistors.

Example 13 is the circuit of Example 12, wherein the first and second discharge devices are n-type metal-oxide-semiconductor (NMOS) transistors.

Example 14 is the circuit of any one of Examples 10-13, wherein the memory cell is a dynamic random access memory (DRAM) cell.

Example 15 is a system, comprising: a memory array; and a charge pump circuit coupled to a word line corresponding to a plurality of memory cells in the memory array, the charge pump circuit comprising: a control logic including a detection logic to detect a signal, where the control logic is coupled to disable an operation of the charge pump circuit in response to the detection of the signal; and a discharge device coupled to an output terminal of the charge pump circuit to accelerate leakage of a leakage current associated with a memory cell of the plurality of memory cells in response to detection of the signal, wherein the disablement of the operation of the charge pump circuit and the acceleration of the leakage of the leakage current are to speed up erasure of the memory cell.

Example 16 is the system of Example 15, wherein the memory array is a dynamic random access memory (DRAM) array.

Example 17 is the system of any one of Examples 15 and 16, wherein the charge pump circuit comprises a first charge pump device and the system further includes a second charge pump device, wherein the second charge pump device is coupled to a transistor back-gate node of an access transistor associated with the memory cell.

Example 18 is the system of Example 17, wherein the discharge device comprises a first discharge device, and the system further comprising a second discharge device coupled to the second charge pump device, wherein an activation of the second discharge device is controllable to accelerate a leakage of current at the access transistor associated with the memory cell.

Example 19 is the system of any one of Examples 15-18, further comprising a voltage generator coupled to the memory cell.

Example 20 is the system of Example 19, wherein the voltage generator circuit is coupled to pull down a voltage level at a cell plate node of a storage node of the memory cell.

Example 21 is the system of any one of Examples 15-20, wherein the signal is a control signal which signals one or more of a sleep mode, hibernation mode, hybrid mode, power-off, and shut-down of a computing device including the memory array.

Example 22 is the system of any one of Examples 19-21, wherein the leakage current is a sub-threshold leakage current of an access transistor of the memory cell.

Example 23 is the system of any one of Examples 15-22, wherein the memory array is an embedded dynamic random access memory (DRAM) array.

Example 24 is the system of any one of Examples 15-23, wherein the discharge device is a p-type metal-oxide-semiconductor (PMOS) transistor.

Example 25 is a circuit for increasing a speed of data erasure in a memory cell, comprising: means for disabling an operation in response to a detected signal; and means for accelerating leakage of a leakage current in response to the detected signal, wherein the leakage current is a leakage current associated with an access transistor of the memory cell and accelerating of the leakage of the leakage current and the disabling of the operation increases the speed of erasure of data in the memory cell.

Example 26 is the circuit of Example 25, wherein the means for disabling the operation comprises means for disabling a ring oscillator.

Example 27 is the circuit of Example 25, wherein the means for accelerating leakage of the leakage current comprises means to short an output signal of a boost circuit from a negative voltage to ground.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A circuit, comprising:
a first discharge device coupled to an access transistor of a memory cell and coupled to an output terminal of a charge pump circuit to pull up a first voltage level at the output terminal to ground in response to a signal to accelerate leakage of a first leakage current; and
a second discharge device coupled to a voltage generator circuit to pull down a second voltage level at a cell plate node of the memory cell to ground in response to the signal to accelerate leakage of a second leakage current, wherein the cell plate node is coupled to a storage node of the memory cell by a capacitor.

2. The circuit of claim 1, wherein the charge pump circuit and the voltage generator circuit each include a control logic to detect the signal.

3. The circuit of claim 2, further comprising a boost circuit coupled to the control logic to allow the control logic to disable an operation of the boost circuit in response to detection of the signal.

4. The circuit of claim 3, further including a ring oscillator coupled to the boost circuit, wherein in response to the detection of the signal, the control logic of the charge pump circuit is to disable the ring oscillator.

5. The circuit of claim 1, wherein the first and second discharge devices are transistors.

6. The circuit of claim 5, wherein the first and second discharge devices are n-type metal-oxide-semiconductor (NMOS) transistors.

7. The circuit of claim 1, wherein the memory cell is a dynamic random access memory (DRAM) cell.

8. The circuit of claim 1, wherein the second discharge device is to open in response to the signal to pull down a voltage of a storage node diffusion region of the storage node to ground.

9. The circuit of claim 1, wherein acceleration of the first leakage current and the second leakage current is to increase a speed of erasure of data in the memory cell.

10. The circuit of claim 1, wherein the signal indicates a power down of the memory cell.

11. The circuit of claim 1, wherein the signal comprises an attack signal received in response to a cold-boot attack.

12. A computer system, comprising:
a memory array including a plurality of memory cells associated with a word line; and
a charge pump circuit coupled to the word line, the charge pump circuit comprising:
a first discharge device coupled to an access transistor of at least one of the memory cells and coupled to an output terminal of the charge pump circuit to pull up a first voltage level at the output terminal to ground in response to a signal to accelerate leakage of a first leakage current; and
a second discharge device coupled to a voltage generator circuit to pull down a second voltage level at a cell plate node of the at least one memory cell to ground in response to the signal to accelerate leakage of a second leakage current, wherein the cell plate node is coupled to a storage node of the at least one memory cell by a capacitor.

13. The computer system of claim 12, further comprising: a processor coupled to the memory array.

14. The computer system of claim 13, further comprising a display coupled to the processor.

15. The computer system of claim 12, wherein the first and second discharge devices are transistors.

16. The computer system of claim 12, wherein the memory cells are dynamic random access memory (DRAM) cells.

17. The computer system of claim 12, wherein the second discharge device is to open in response to the signal to pull down a voltage of a storage node diffusion region of the storage node to ground.

* * * * *